United States Patent [19]

Cushman

[11] Patent Number: 4,616,414

[45] Date of Patent: Oct. 14, 1986

[54] METHOD AND APPARATUS FOR GRIPPING MULTILEAD ARTICLES

[75] Inventor: Robert H. Cushman, Princeton Township, Mercer County, N.J.

[73] Assignee: AT&T Technologies, Inc., Barkeley Heights, N.J.

[21] Appl. No.: 711,314

[22] Filed: Mar. 13, 1985

[51] Int. Cl.[4] .......................... H05K 3/30; B23P 19/00
[52] U.S. Cl. ........................................ 29/835; 29/741; 29/758; 29/837; 29/838
[58] Field of Search ................ 29/741, 750, 758, 835, 29/837, 838

[56] References Cited

U.S. PATENT DOCUMENTS

| 3,442,430 | 5/1969 | Ackerman et al. | 227/2 |
| 3,516,142 | 6/1970 | De Rose | 29/741 |
| 3,550,238 | 12/1970 | Allen et al. | 29/203 |
| 3,564,691 | 2/1971 | Ackerman | 29/203 |
| 3,688,393 | 9/1972 | Halstead | 29/626 |
| 4,030,180 | 6/1977 | Pierson | 29/741 |
| 4,283,836 | 8/1981 | Janisiewicz et al. | 29/564 |
| 4,293,998 | 10/1981 | Kawa et al. | 29/564 |
| 4,367,584 | 1/1983 | Janisiewicz et al. | 29/837 |
| 4,392,301 | 7/1983 | Hannes et al. | 29/758 X |
| 4,461,073 | 7/1984 | Harringer et al. | 29/741 |
| 4,521,959 | 6/1985 | Sprenkle | 29/758 X |
| 4,543,713 | 10/1985 | Rapp | 29/741 X |

OTHER PUBLICATIONS

The article "Component Insertion Head" by W. C. Kent published in the Western Electric Technical Digest, No. 70, Apr. 1983, pp. 11-12.

Primary Examiner—Mark Rosenbaum
Assistant Examiner—Carl J. Arbes
Attorney, Agent, or Firm—R. B. Levy

[57] ABSTRACT

An apparatus (24) for gripping a multilead article (18) and inserting the leads (20—20) thereof into corresponding apertures (22) in a printed circuit board (12) comprises a plate (26) underlying a block (30) spring biased thereagainst. The block (30) has a pair of parallel, spaced-apart jaws (38, 40) mounted to opposite sides thereof so as to depend below the plate. At least one jaw (40) is movable towards or away from the other to capture the article (18) therebetween. The jaws (38, 40) each have one of a pair of opposing combs (50) thereon, each comb having spaced-apart slots (52) therein for seating each of the leads of the article captured between the jaws. To insert the article (18), the gripping apparatus (24) is moved by a robot arm (29) to a predetermined location above the circuit board (12) so that each slot (52) in each comb (50) is aligned with a corresponding aperture (22). The article (18) is forced from the apparatus (24) so that the leads (20—20) thereof are guided along the slots (52—52) and into the apertures (22—22) in the board (12).

7 Claims, 9 Drawing Figures

METHOD AND APPARATUS FOR GRIPPING MULTILEAD ARTICLES

TECHNICAL FIELD

This invention relates generally to a method and apparatus for gripping multilead articles, such as a hybrid integrated circuit having depending, dual, in-line flexible leads.

BACKGROUND OF THE INVENTION

Many manufacturers of electronic devices are now turning away manual insertion of components into circuit boards and, instead, are relying on automated insertion techniques in an effort to reduce labor costs and fabrication time. To this end, machines have been especially developed for automatically inserting components into circuit boards. Examples of an automated component insertion machine are found in U.S. Pat. Nos. 4,030,180 to M. V. Pierson, 4,283,836 to S. Janisiewicz et al. and 4,367,584 to S. Janisiewicz et al.

While present day automated component insertion machines are capable of inserting components having rigid, dual in-line leads, problems often arise in attempting to utilize such machines to insert components having very flexible dual in-line leads, particularly components having as many as 20 flexible leads on each side thereof. Flexible leads are often provided on the component to substantially absorb the shock imparted thereto when the circuit board to which the component is mounted is flexed.

One reason why components having flexible leads are difficult to insert is because of the inability of present day insertion machines to align each of the many leads with corresponding apertures in the circuit board. If the flexible leads depending from the component are sufficiently misaligned with the corresponding apertures, then the leads are likely to bend as they contact the circuit board for insertion therein. The greater the flexibility of the lead on the component, the more likely the lead will bend when misaligned with the corresponding aperture in the board. Further, the greater the lead flexibility, the more likely the leads will become bent during normal handling of the part prior to insertion.

Should the leads of the component become sufficiently bent so as to preclude insertion into the circuit board, then the component may have to be reworked or even discarded. Reworking the component to straighten the leads thereof is time consuming and delays the insertion process. Discarding a component, once the leads have become sufficiently bent to preclude the straightening thereof, can prove expensive especially if the component is costly.

A greater problem may result if a component having bent leads is actually inserted and then the leads are then soldered to the board. Should one or more leads of the component not be received in the proper aperture in the board by virtue of having become bent then the circuit board will not operate properly. Detection and correction of such faults is a very expensive and difficult procedure.

In an effort to overcome the problem of lead misalignment, U.S. Pat. No. 3,442,430 issued May 6, 1969 to D. W. Ackerman et al. discloses a component insertion machine which utilizes slotted combs for guiding the leads into the apertures in the board. Each of the combs of Ackerman et al. is located on the tip of each of a pair of spaced apart inwardly tapered, resilient fingers. The fingers are located on opposite sides of a reciprocatable insertion ram having a component carrying head mounted to its bottom end. As the insertion ram is driven downwardly to insert a component carried by the head, the leads on the component are received in slots in the combs and are guided thereby into the corresponding apertures in the circuit board.

Like other prior art component insertion machines, the Ackerman et al. machine may incur difficulties in inserting components having very flexible leads. If the leads of the component are somewhat bent, then, as the insertion ram is driven downwardly, the leads of the component may catch on the combs before entering the slots therein. As a result, further lead bending may occur, which may prevent component insertion.

The foregoing problems associated with the insertion of components having flexible dual in-line depending leads are particularly severe with hybrid integrated circuits. Hybrid integrated circuits (HIC's) are electronic components comprised of a component-carrying ceramic substrate having a plurality of very flexible leads depending from opposite sides thereof. Some hybrid integrated circuits have as many as 100 leads depending from each side of the substrate which makes alignment of each of the leads thereof with the corresponding apertures in the circuit board extremely difficult. Moreover, the leads of the HIC are so flexible that after they are soldered into the apertures of the circuit board, the force required to pull them out during desoldering to correct for a misinserted HIC will cause sufficient bending of the leads as to preclude reworking thereof. Since present day HIC's are expensive, it is desirable to insert the leads properly.

Accordingly, there is a need for a technique for inserting the flexible leads of a hybrid integrated circuit into corresponding apertures on a printed circuit board without bending.

SUMMARY OF THE INVENTION

The foregoing disadvantages are overcome by the present invention for inserting each of the leads depending from opposed sides of an article into corresponding apertures in a substrate. The instant method comprises the steps of: releasably gripping the article between a pair of opposed, parallel, spaced jaws, having depending, opposed combs which have spaced slots therein, to seat the leads of the article in a separate one of the slots in the combs; positioning the jaws to locate the combs proximate the substrate so that each slot in each comb is aligned with a corresponding aperture in the substrate; applying a force to the article to urge each lead within each slot therealong so that the leads are guided thereby into the corresponding aperture in the substrate; and releasing the article once all the leads thereof have been inserted into the corresponding apertures in the substrate.

DETAILED DESCRIPTION

Figure 1:
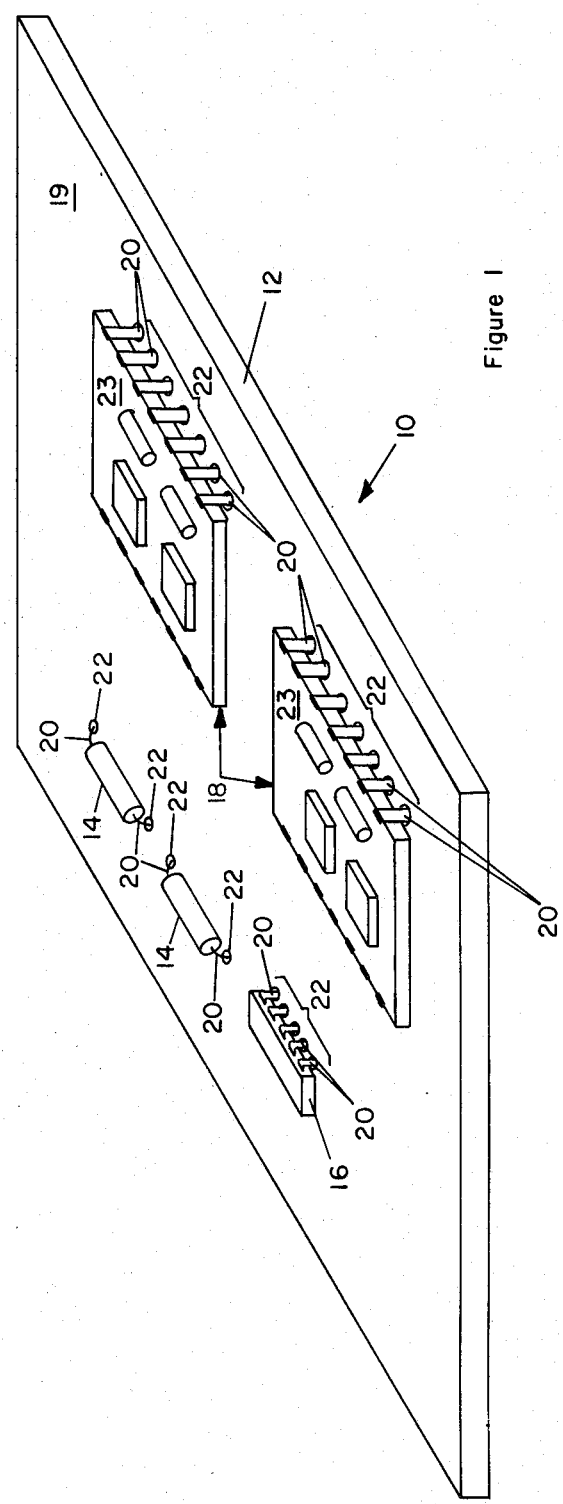
FIG. 1 is a perspective view of a circuit package.

FIG. 1 illustrates an electrical circuit package 10 referred to as a circuit pack, which is often found in various types of electronic equipment. The circuit pack 10 is typically comprised of a printed circuit board 12 having one or more components, such as a plurality of resistors 14—14, an integrated circuit 16 and a plurality of hybrid integrated circuits (HIC's) 18—18, mounted on a major surface 19 thereof. The exact number and type of components mounted on the circuit board 12 will depend on the function of the circuit pack 10. The circuit pack 10 may, depending on its function, include other types of electronic components (not shown).

Each of the resistors 14—14, the integrated circuit 16 and the hybrid integrated circuits 18—18 have a plurality of depending electrical terminal leads 20—20 which are received in corresponding apertures 22—22 in the board 12, the apertures being arranged in the same pattern as that of the terminal leads on each component. For example, the integrated circuit 16 and the HIC's 18—18 each have dual in-line terminal leads 20—20; that is to say, the leads on each component are arranged in two spaced-apart rows. The apertures 22—22 in the board 12 which receive the leads 20—20 of the integrated circuit 16 and the HIC's 18—18 are likewise arranged in two spaced-apart rows.

The resistors 14—14 and the integrated circuit 16 have relatively rigid leads 20—20 which reduces the likelihood of the leads becoming bent as they contact the circuit board 12 during insertion into the apertures 22—22. The rigidity of the leads 20—20 on the resistors 14—14 and on the integrated circuit 16 permit such components to be accurately inserted into the apertures 22—22 of the circuit board 12 by present day component insertion machines (not shown).

As compared to the leads 20—20 depending from the resistors 14—14 and the integrated circuit 16, the leads 20—20 of each of the HIC's 18—18 are relatively flexible because they are typically thinner and are made from a softer temper material. The reason for the greater flexibility of the leads 20—20 arises from the construction of the HIC 18. Usually the HIC 18 is comprised of a thin component-carrying ceramic substrate 23 from which the leads 20—20 depend. The leads 20—20 are made flexible, so that flexing of the circuit board 12 is substantially absorbed by the leads rather than being transmitted to the substrate 23 of the HIC 18, thus preventing cracking thereof.

The flexibility of the leads 20—20 on the HIC's 18—18 generally prevents such devices from being inserted by present day component insertion machines. Typically, present day component insertion machines experience great difficulty in aligning all of the flexible leads of the HIC 18 with the corresponding apertures 22—22 in the board 12. As a result, the leads 20—20 of the HIC 18 often bend upon the attempted insertion, requiring the HIC to be reworked or even discarded. Detecting which of the leads 20—20 on the HIC 18 is bent is usually time consuming. Moreover, since each HIC 18 is expensive, discarding a device whose leads 20—20 are bent greatly increases the fabrication cost of the circuit pack 10.

Figure 2:
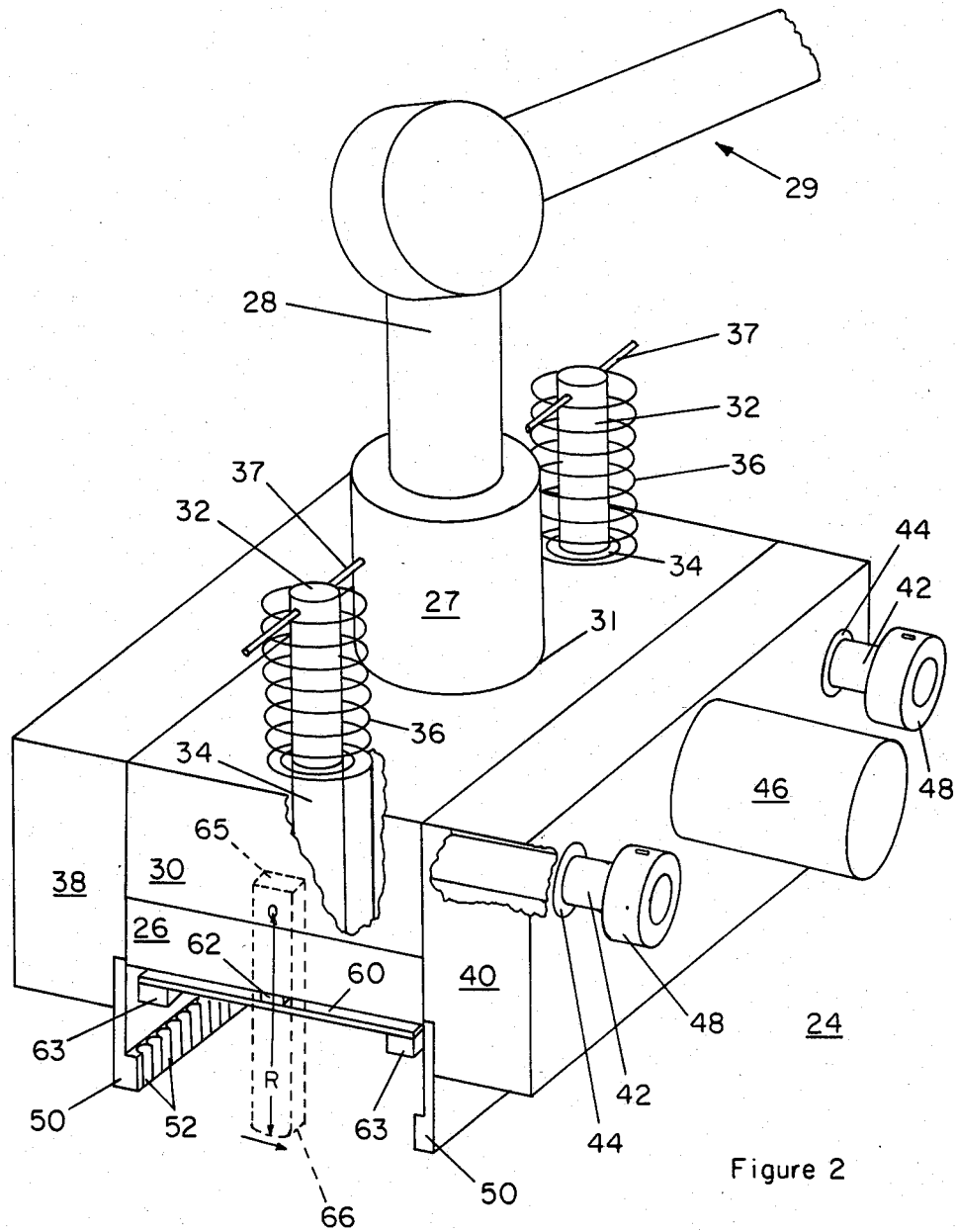
FIG. 2 is a perspective view of the gripper of the present invention for gripping and inserting multilead articles.

FIG. 2 is an isometric view of an improved gripper 24 designed for gripping and inserting a component having dual, in-line, flexible leads, such as the HIC 18 of FIG. 1. The gripper 24 comprises a plate 26 having an integral hub 27 projecting upwardly therefrom. The hub 27 is secured to a shaft 28 of a robot arm 29 which moves under program control. The plate 26, the hub 27, the shaft 28 and the robot arm 29 form a single, relatively rigid structure which only moves when the robot arm is programmed to do so. Various types of programmable robot arms are known to those skilled in the art and are commercially available. One robot arm which has been found particularly well suited for use with the gripper 24 is the model 7535 Selective Compliance Articulated Robotic Arm (SCARA) sold by IBM Corporation, White Plains, N.Y.

Overlying the plate 26 is a block 30 having an opening 31 therein through which the hub 27 protrudes. The block 30 is slidably mounted for relative movement towards or away from the plate 26 along each of a pair of pins 32—32 which are fastened to, and extend upwardly from the plate on either side of the hub 27. The pins 32—32 each pass through a separate one of a pair of bushings 34—34 in the block 30. Each of a pair of compression springs 36—36 surrounds a separate one of the pins 32—32 and is contained in place against the block 30 by a short dowel 37 passing horizontally through the upper end of the pin. The springs 36—36 yieldably urge the block 30 against the plate 26.

A first jaw 38 is fixedly mounted to one side of the block 30 so that the lower edge of the jaw extends below the plate 26. A second jaw 40 is slidably mounted to the opposite side of block 30 by each of a pair of parallel, spaced-apart pins 42—42, each fastened to the block so as to extend therefrom through each of a pair of bushings 44—44 in the jaw. Since the opposed sides of the block 30 are parallel to each other, the jaws 38 and 40 are also parallel to each other. Like the jaw 38, the jaw 40, which is opposed thereto, extends below the plate 26. The block 30, together with the jaws 38 and 40 mounted thereto, comprise a single assembly which is movable relative to the plate 26.

The jaw 40 is movable along the pins 42—42 to and from the opposed jaw 38 by an actuator 46. In practice, the actuator 46 may comprise a pressurized fluid cylinder or an electromagnetic solenoid fastened to the jaw 40. The actuator 46 has a shaft (not shown) which protrudes outwardly therefrom through the jaw 40 for attachment to the block 30. Thus, upon activation of the actuator 46, the jaw 40 is urged from the block 30. A stop 48, which takes the form of a collar, is secured to each pin 42 adjacent to the outermost end thereof to limit the travel of the jaw 40 away from the jaw 38. Alternatively, the travel of the jaw 40 can be limited by the extent of travel of the shaft of the actuator 46, thereby obviating the need for the stops 48—48.

Figure 3:
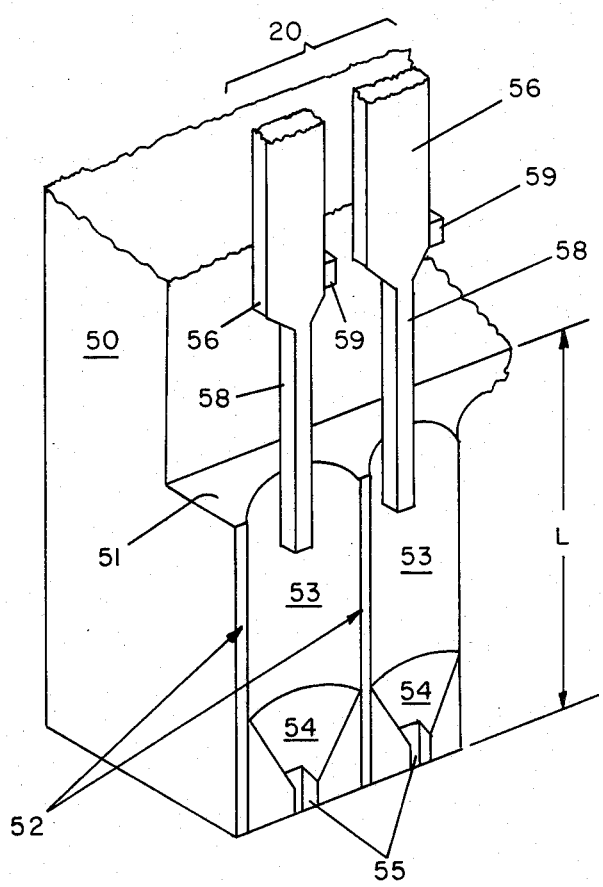
FIG. 3 is an enlarged view of a portion of a comb on the apparatus of FIG. 2.

Depending from the lower portion of each of the jaws 38 and 40 is a separate one of a pair of opposed combs 50—50, each fixedly mounted to a corresponding jaw. The details of each comb 50 are illustrated in FIG. 3. Referring to that figure, each comb 50 is provided with a lip 51 running horizontally therealong so as to oppose the lip on the other comb (not shown). A plurality of vertical, spaced-apart, parallel slots 52—52 are formed into the lip 51. The number of slots 52—52 and the spacing therebetween corresponds to the number of, and the spacing between the leads 20—20 on each side of the HIC 18 (see FIG. 1). In practice, there are typically thirty-six leads 20—20 depending from each side of the HIC 18, so there are at least thirty-six slots 52—52 in the lip 51 on each comb 50.

Each of the slots 52—52 is comprised of an elongated, half-rounded section 53 which leads into a much shorter half-rounded tapered section 54 at the bottom thereof. The tapered section 54 of each slot 20 has a rectangular notch 55 at the bottom thereof. The overall length L of each slot 52 is much less than the length of the lead 20.

In practice, each of the leads 20—20 comprises a rectangular-shank portion 56 from which a smaller-sized rectangular tip portion 58 depends. Typically, the shank portion 56 of the lead 20 often has a protruding tab or stub 59 thereon as a consequence of the lead having been sheared from a large strip during the fabrication of the HIC 18 of FIG. 1. To enable each lead 20 to be received in each slot 52, the radius of the half-rounded elongated portion 53 is sized large enough to receive the shank portion 56 of the lead with its protruding tab 59. The tapered portion 54 of the slot 52 is sized to accommodate the tip portion 58 of the lead and guide it into the notch 55.

Referring to FIG. 2, a resilient sheet 60 is affixed to the bottom of the plate 26 by screws 61 (only one of which is shown). The sheet 60 is not directly in contact with the plate 26 but is offset therefrom by a spacer 62 interposed therebetween. The spacer 62 runs along the entire length of the sheet 60 so as to be equidistant from the sides thereof, permitting the sides of the sheet to flex towards the plate 26. Each of a pair of rigid smooth strips 63—63 is affixed either by glue or by screws (not shown) to the undersurface of the sheet 60 so as to run along each of the edges thereof.

Figure 4:
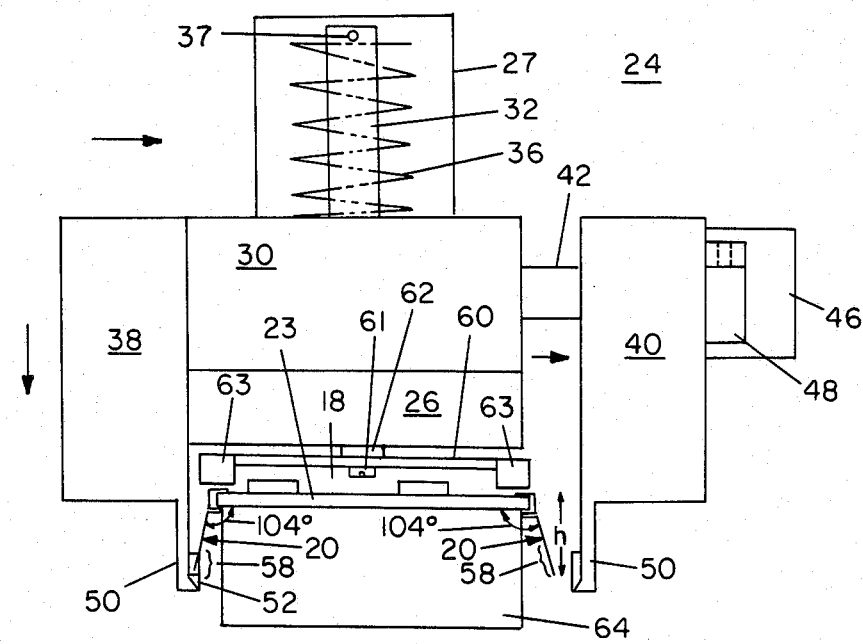
FIGS. 4, 5, 6 and 7 each illustrate an end view of the gripper of FIG. 2 during the steps of initially aligning the gripper with the article, gripping the article, inserting the leads of the article into corresponding apertures in a circuit board and releasing the article, respectively.

The steps associated with pick up by the gripper 24 of the HIC 18 and insertion of the leads 20—20 thereof into the corresponding apertures 22—22 in the circuit board 12 are sequentially illustrated in FIGS. 4-7. Referring to FIG. 4, to pick up the HIC 18, the actuator 46 on the gripper 24 is operated to displace the jaw 40 to its outwardmost position from the jaw 38 to "open" the gripper. The robot arm 29 (see FIG. 2) is then operated under program control to move the now open gripper 24 to bring the sheet 60 above the HIC 18 whose substrate 23 is supported by a block 64 at a pick-up station (not shown) so that ends of the leads 20—20 of the HIC are above the bottom of the block.

The gripper 24 is lowered to position the sheet 60 a preset distance from the HIC 18 so that the comb 50 on each of the jaws 38 and 40 is slightly below the bottom of each of the leads 20—20. With the plate 60 still a preset distance above the HIC 18, the robot arm 29 moves the gripper 24 laterally to bring the comb 50 on the jaw 38 adjacent to one side of the HIC. The robot arm 29 continues to move the gripper 24 laterally towards the HIC 18 until the tip portion 58 of each of the leads 20—20 is seated in a corresponding one of the slots 52—52 in the comb 50 on the jaw 38.

It is important that the robot arm 29 bring the jaw 38 against the HIC 18, so that tip portion 58 of each lead 20, will be seated within the straight portion 53 (see FIG. 3) of each slot 52. In this way, the tip portion 58, which is typically longer than the overall length L of the slot 52 (see FIG. 3), will be guided by the tapered portion 54 into the notch 55 thereby automatically centering the shank portion 56 within the straight portion 53 of the slot. By centering the shank portion 56 in the straight portion 53 of the slot 52, the problem of the tab 59 catching on the upper edge of the slot is avoided.

Figure 5:
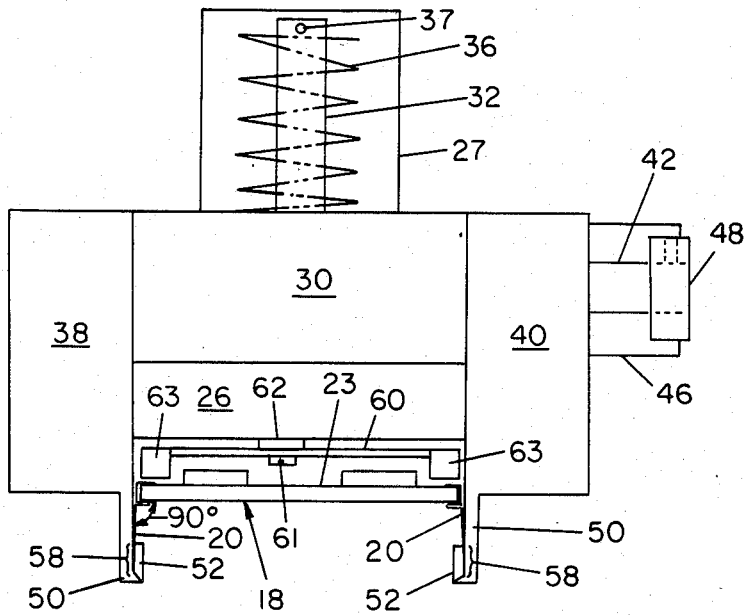

Referring to FIG. 5, once the tip portion 58 of each of the leads 20—20 on one side of the HIC 18 has been seated in the straight portion 53 (FIG. 3) of a corresponding one of the slots 52—52 in the comb 50 on jaw 38, the actuator 46 is operated to move the jaw 40 inwardly towards block 30 to "close" the gripper 24. Upon closing of the gripper 24, the tip portion 58 of each lead 20 on the side of the HIC 18 adjacent to jaw 40 is seated in a corresponding one of straight portions 53 (FIG. 3) of the slots 52—52 in the comb on that jaw. As jaw 40 moves toward the jaw 38 to capture the HIC 18 therebetween as seen in FIG. 5, the leads 20—20 which normally flair outwardly from opposed sides of the HIC at an angle of approximately 104°, as illustrated in FIG. 4, are urged inwardly by the combs 50—50, so that each lead now becomes substantially vertical. It is usually necessary to urge the leads 20—20 on opposed sides of the HIC 18 towards each other to reduce the angle to approximately 90° so that the spacing between opposed leads corresponds to the spacing between opposed apertures 22—22 in the board 12.

Figure 6:
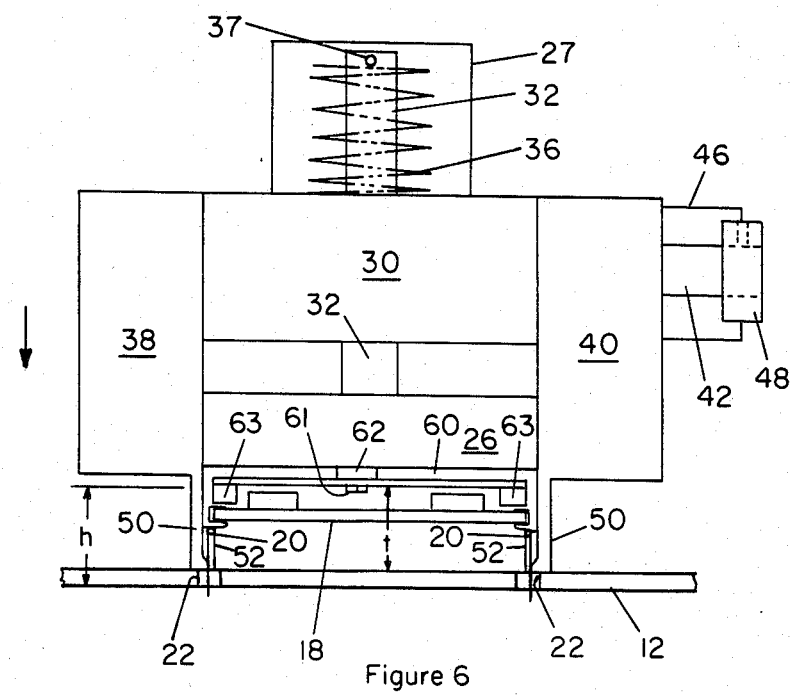

FIG. 6 illustrates the step of inserting the leads 20—20 of the HIC 18 gripped by the gripper 24 into the apertures 22—22 of the circuit board 12. To accomplish insertion, the robot arm 29 (see FIG. 2) is programmed to move the gripper 24 to bring the sheet 60 to a predetermined location above circuit board 12 a distance t therefrom to align each slot 52 in each comb 50 with a corresponding aperture 22 in the board. The distance t is less than the overall height of the HIC. Thus, as the sheet 60 is brought to a position above the circuit board 12 a distance t therefrom, the strips 63—63 contact the ceramic substrate 23 of the HIC 18, forcing it towards the circuit board. As the HIC 18 is urged towards the circuit board 12, each lead 20 is guided along the straight portion 53 (see FIG. 3) of each slot 52 of each of the combs 50—50 which come into contact with the circuit board when the gripper 24 is positioned by the robot arm 29 thereabove. The tip portion 58 of the lead 20 passes from the straight portion 53 into the tapered portion 54 (see FIG. 3), and then passes therefrom through the notch 55 (FIG. 3) into the aperture 22 in the board 12. Guiding the tip portion 58 of each of the leads 20—20 serves to reduce the likelihood of bending thereof so as to reduce the chance of misinsertion into the apertures 22—22.

As they contact the HIC 18, the strips 63—63 advantageously offset the component carrying ceramic substrate 23 from the sheet 60. Since the sheet 60 is resilient, the ends thereof will flex (although not shown in FIG. 6) as the strips 63—63 contact the HIC 18, cushioning the impact thereagainst.

Figure 7:
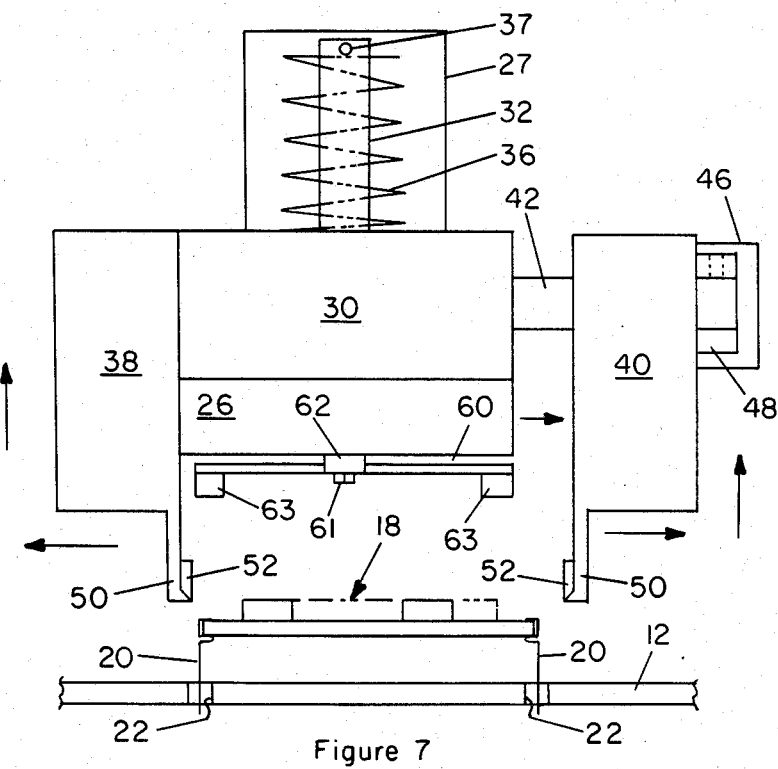

Once the leads 20—20 of the HIC 18 have been inserted into the corresponding apertures 22—22 in the board 12 as shown in FIG. 6, the actuator 46 is operated to displace the jaw 40 outwardly from the block 30 away from the jaw 38 to open the gripper 24 as illustrated in FIG. 7. Simultaneously with the movement of the jaw 40, the robot arm 29 (FIG. 2) is operated to displace the gripper 24 laterally to move the jaw 38 away from the HIC 18. The gripper 24 is then moved upwardly from the now inserted HIC 18 before the above-described insertion process is repeated.

Note that the distance which the gripper 24 must be moved by the robot arm 29 to displace the jaw 38 away from the leads 20—20 on the HIC 18 after insertion thereof into the board 12 will be smaller as compared to the amount of movement required to urge the leads towards each other to reduce the angle each makes with the HIC to 90°. Accordingly, the robot arm 29 is programmed to move the gripper 24 to displace the jaw 26 a smaller distance away from HIC 18 following insertion thereof as compared to the distance the gripper is moved toward the HIC during pick up thereof. Thus, the workspace required to insert the HIC 18 is smaller than that required to pick it up which is advantageous because the reduced workspace reduces the likelihood of interference between the gripper 24 and other components previously inserted in the board.

Referring back to FIG. 2, the gripper 24 can be advantageously modified to include a pair of cam levers 65 (only one of which is shown in phantom), each pivotally mounted to a separate one of the opposed ends of the block 30 for limited rotational movement. Each cam lever 65 has a rounded lower edge 66 of a radius R which depends below the combs 50—50 on each of jaws 38 and 40 for contacting the circuit board 12 (see FIGS. 1 and 6), when the robot arm 29 moves the gripper 24 to position the sheet 60 to its predetermined location above the circuit board to accomplish insertion of the HIC 18 (see FIG. 1). Thus, the cam levers 65—65 serve to offset the combs 50—50 from the circuit board, thereby preventing scratching of the board by the comb on the jaw 40 when the gripper 24 is opened. The pivotal mounting of each of the cam levers 65—65 to the opposed ends of the block 30 allows the rounded lower end 66 of each to roll on the board 12 (see FIG. 1) as the gripper 24 is moved laterally thereacross to avoid scratching of the board by the cam lever.

Figure 8:
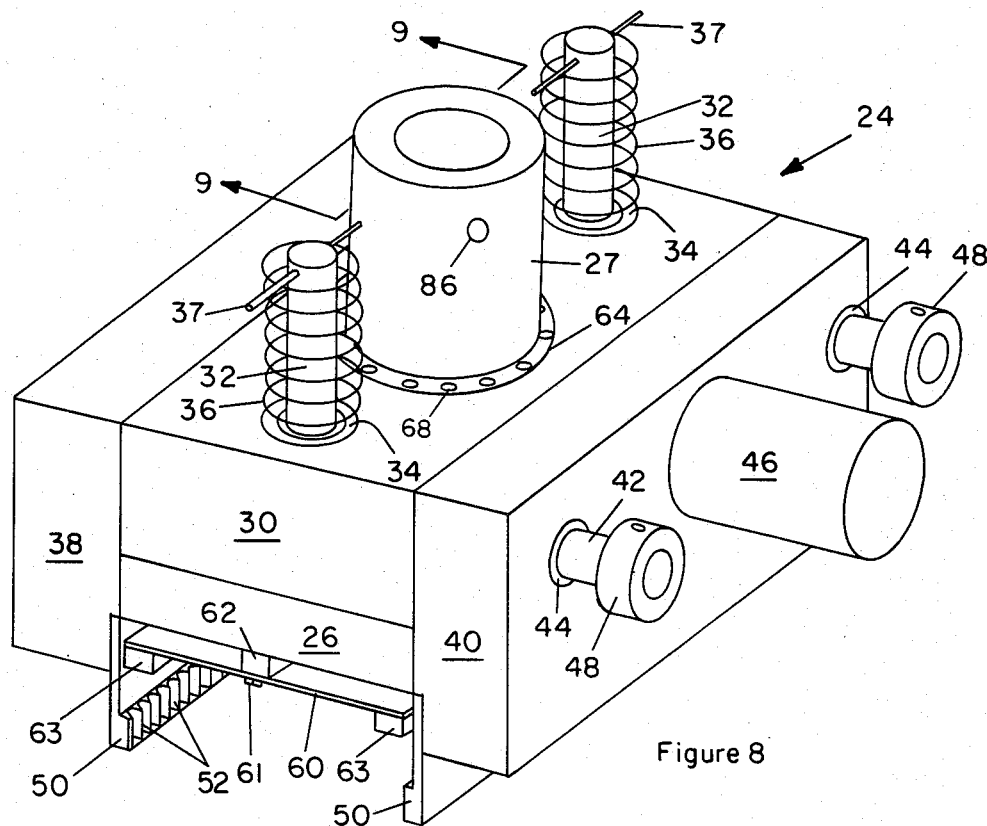
FIG. 8 is a perspective view of another illustrative embodiment of the gripper of the present invention.

FIG. 8 is a perspective view of another embodiment of the gripper 24. The same reference numbers have been employed in FIG. 8 as in FIGS. 2-7 to reference like elements on the gripper 24. The gripper 24 of FIG. 8 differs in that its hub 27 is affixed to the block 30 by screws 68 whereas the hub 27 of the gripper 24 of FIGS. 2-7 is integral with the plate 26. Like the gripper 24 of FIGS. 2-7, the hub 27 of the gripper 24 of FIG. 8 is attached to the shaft of the robot arm (not illustrated in the figure). The block 30 of the gripper 24 of FIG. 8 does not move relative to the robot arm by virtue of being rigidly attached thereto by the hub 27. Rather, the plate 26 is free to move to and from the block 30 along the pins 32—32. The complete opposite is true with the gripper 24 of FIGS. 2-7 since the plate 26 thereof is fixed to the robot arm 29 and it is the block 30 which moves with respect to the plate along the pins 32—32.

Figure 9:
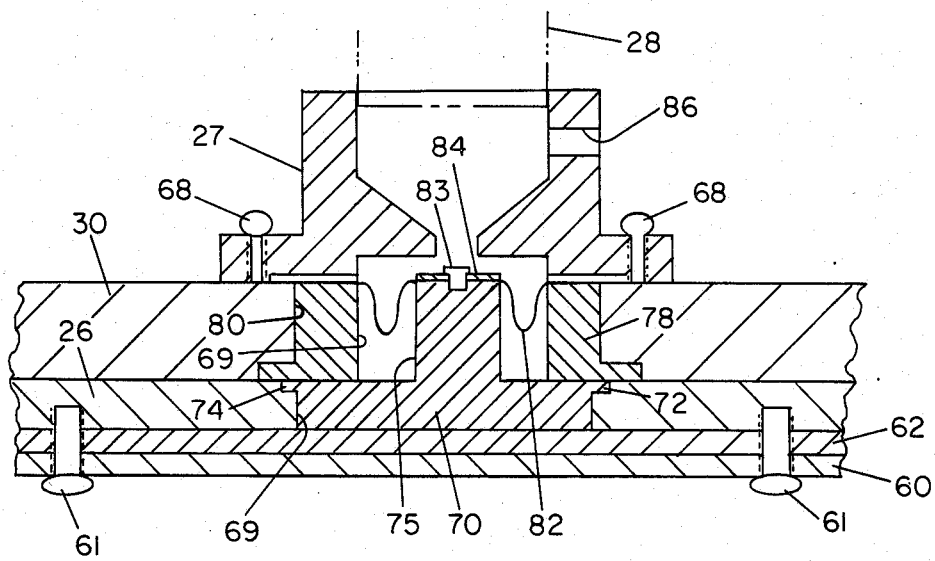
FIG. 9 is a cross-sectional view of the gripper of FIG. 8 taken along the plane 9—9 thereof.

The gripper 24 of FIG. 8 includes a piston arrangement, whose details are illustrated in FIG. 9, displacing the plate 26 from the block 30. As illustrated, the plate 26 is provided with a bore 69 therethrough. The bore 69 in the plate 26 receives a cylindrical disc 70 which is pressed therein. The disc 70 has an integral rim 72 about its periphery for seating in a corresponding counter bore 74 provided in the plate 26 in coaxial alignment with the bore 69 to prevent the disc from slipping therethrough.

A shaft 75 is integral with the disc 70 and extends upwardly therefrom into a bushing 78 pressed into a bore 80 through the block 30. The bushing 78 has a bore 81 therethrough which is larger than the diameter of shaft 75. A circular bellows 82 is affixed at its center to the upper end of the shaft 75 by way of a screw 83 and a washer 84. The periphery of the bellows 82 is clamped by the hub 27 against the top of the bushing 78.

The disc 70 and shaft 75 comprise a piston, which is biased downwardly from block 30 upon the admission of compressed air through an opening 86 in the hub 27. Alternatively, the compressed air could also be directed into the hub 27 through the robot shaft 29 when the same is made hollow. The compressed air is directed against the bellows 82 which causes the bellows to unroll and expand, forcing the shaft 75, the disc 70, plate 26 and the sheet 60 downwardly from the block 30. As the plate 26 is urged away from the block 30, the springs 32—32 of FIG. 8, which are shown in their uncompressed state, will be compressed. When the force of the compressed air against the bellows 82 is interrupted, the springs 32—32 urge the plate 26 upwardly against the block 30 causing the bellows to roll up and return to its normal, unextended state.

Referring now to FIG. 8, when the plate 26 is yieldably urged downwardly from the block 30, the strips 63—63 on the sheet 60 will bear against a HIC (not shown) captured between the jaws 38 and 40. If the gripper 24 has been moved to position the sheet 60 to a predetermined location above a circuit board (not shown) so that the slots 52—52 in the combs 50—50 are aligned with corresponding apertures in the board, then the tip portion of each lead (not shown) of the HIC will be guided along each slot and into the aperture upon downward movement of the plate.

To improve the operation of the gripper 24 of FIGS. 2-7 and the gripper 24 of FIGS. 8 and 9, it may be desirable to slidably mount the jaw 38 to the block 30 in the same manner that the jaw 40 is slidably mounted thereto. Providing the gripper 24 with two slidably mounted jaws affords the advantage of reducing the workspace required by the gripper to pick up and insert a HIC. Ideally, the amount of movement of each of the jaws of such a gripper would be different. The jaw having the smaller amount of outward movement would be placed on the side of the HIC 18 which, during insertion, will be closer to other nearby, previously inserted components to allow closer spacing between the adjacent HIC's inserted into the board. The jaw having the larger outward movement would be positioned to overlie the area on the circuit board 12 which is to be occupied by the next HIC 18 to be inserted.

It is to be understood that the embodiments described herein are merely illustrative of the principles of the invention. Various modifications and changes may be made thereto by persons skilled in the art which will embody the principles of the invention and fall within the spirit and scope thereof.

What is claimed is:

1. A method for inserting each of a plurality of flexible leads depending from opposed sides of an article into corresponding apertures in a substrate comprising the steps of:
    releasably gripping the article between a pair of opposed, parallel, spaced jaws having opposed depending combs which have spaced slots therein, each slot including an elongated upper section whose cross-section is half-rounded and a tapered lower section, to seat the tip of each lead article in the upper section of a separate one of the slots in the combs;
    positioning the jaws to locate the combs proximate the substrate so that the tapered lower section of each slot in each comb is aligned with a corresponding aperture in the substrate;

applying a force to the article to urge the tip of each lead from the upper section into, and along the lower section of, each slot so that the tips of the leads are guided into the corresponding aperture in the substrate; and releasing the article once all the tips of the leads thereof have been inserted into the corresponding apertures in the substrate by moving the jaws laterally apart.

2. The method according to claim 1 wherein the step of positioning the jaws to locate the combs proximate the substrate comprises the step of bringing the combs into contact with the substrate.

3. The method according to claim 1 wherein the step of positioning the jaws to locate the combs proximate the substrate comprises the step of bringing the combs to a position spaced from the substrate at a distance less than the length of the leads.

4. Apparatus for inserting each of a plurality of flexible leads depending from opposed sides of an article into corresponding apertures in a substrate comprising:
   a body having first and second opposed sides;
   a first jaw mounted to and depending from the first side of said body for gripping one of the opposed sides of the article;
   a second jaw slidably mounted to, and depending from said second opposed side of said body so as to be opposite to said first jaw for contacting the other opposed side of the article;
   means connected between said body and said second jaw for moving said second jaw towards said first jaw to capture the article therebetween;
   the first and second jaws having opposed combs thereon, each comb having spaced slots therein, the slots each having an upper substantially elongated section whose cross-section is half-rounded and a lower tapered section, the slots guiding the tips of the leads of the captured article into corresponding apertures in the substrate; and
   means slidably mounted to said body for urging an article captured between the first and second jaws towards the substrate to move the tip of each lead along the slot and into the corresponding in the substrate.

5. The invention according to claim 4 wherein the lower tapered section of each slot leads into a notch at the bottom thereof.

6. Apparatus for inserting each of a plurality of flexible leads depending from opposed sides of an article into corresponding apertures in a substrate comprising:
   a body having first and second opposed sides;
   a first jaw mounted to, and depending from the first side of the body for contacting one of the opposed sides of the article;
   a second jaw slidably mounted to, and depending from said second opposed side of said body so as to be opposite to said first jaw for contacting the other opposed side of the article;
   means connected between said body and said second jaw for moving said second jaw towards said first jaw to capture the article therebetween;
   the first and second jaws having opposed combs thereon, each comb having spaced slots therein, the slots each having a substantially elongated upper section whose cross section is half-rounded and a lower tapered section, the slots guiding the tips of the leads of the captured article into corresponding apertures in the substrate;
   a plate underlying said body so as to be located between said first and second jaws;
   first and second pins each fastened to and projecting upwarding from said plate into a separate one of a pair of pin recieving apertures in said body so as to extend therebeyond;
   first and second springs each carried by, and mounted to, said first and second pins, respectively, so as to contact said body for urging said plate against said body;
   a resilient sheet secured to and spaced from the undersurface of said plate;
   a pair of strips each depending from opposed edges of said sheet; and
   moving means carried by said body and attached to said plate for displacing said plate from said body to urge the article captured between said first and second jaws towards the substrate and thereby move the tip of each lead along the slot and into the corresponding apertures in the substrate.

7. The invention according to claim 6 wherein said moving means comprises:
   a cylinder within said body;
   a piston reciprocally disposed within said cylinder and attached to said plate;
   a circular bellows clamped at its center to the piston and clamped at its edges to said cylinder in which said piston is located; and
   means in said body for admitting pressurized fluid into said cylinder against said bellows to force said piston from said cylinder.

* * * * *